United States Patent
Iyanagi

(10) Patent No.: US 8,171,434 B2
(45) Date of Patent: May 1, 2012

(54) METHOD FOR DIMENSION CONVERSION DIFFERENCE PREDICTION, METHOD FOR MANUFACTURING PHOTOMASK, METHOD FOR MANUFACTURING ELECTRONIC COMPONENT, AND PROGRAM FOR DIMENSION CONVERSION DIFFERENCE PREDICTION

(75) Inventor: Katsumi Iyanagi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 729 days.

(21) Appl. No.: 12/238,018

(22) Filed: Sep. 25, 2008

(65) Prior Publication Data
US 2009/0089727 A1    Apr. 2, 2009

(30) Foreign Application Priority Data
Sep. 26, 2007   (JP) ................................ 2007-250221

(51) Int. Cl.
*G06F 17/50* (2006.01)
(52) U.S. Cl. ............................... 716/53; 716/50; 716/51
(58) Field of Classification Search ............... 716/50–55
See application file for complete search history.

(56) References Cited

U.S. PATENT DOCUMENTS

| 7,328,425 | B2 * | 2/2008 | Olsson et al. | 716/53 |
| 7,412,671 | B2 * | 8/2008 | Ito et al. | 716/136 |
| 7,560,197 | B2 * | 7/2009 | Nakamura et al. | 430/5 |
| 7,689,968 | B2 * | 3/2010 | Sato | 716/53 |
| 2001/0049811 | A1 * | 12/2001 | Taoka | 716/4 |
| 2005/0026050 | A1 * | 2/2005 | Ozawa et al. | 430/5 |
| 2005/0086618 | A1 * | 4/2005 | Ito et al. | 716/4 |
| 2005/0196684 | A1 * | 9/2005 | Nakamura et al. | 430/5 |
| 2007/0067752 | A1 * | 3/2007 | Moon | 716/21 |
| 2008/0178141 | A1 * | 7/2008 | Sato | 716/19 |
| 2010/0031225 | A1 * | 2/2010 | Ivansen | 716/21 |

FOREIGN PATENT DOCUMENTS

JP       2004-363390       12/2004

* cited by examiner

*Primary Examiner* — Stacy Whitmore
(74) *Attorney, Agent, or Firm* — Oblon, Spivak, McClelland, Maier & Neustadt, L.L.P.

(57) ABSTRACT

A method for dimension conversion difference prediction includes: determining an opening angle at a conversion difference prediction point on basis of a design pattern data; and predicting a dimension conversion difference on basis of correlation between the opening angle and an actual measurement value of the dimension conversion difference, or a method for dimension conversion difference prediction includes: determining an incident amount of incident objects at a conversion difference prediction point on basis of a design data; and predicting a dimension conversion difference on basis of correlation between the incident amount and an actual measurement value of the dimension conversion difference.

7 Claims, 9 Drawing Sheets

METHOD FOR DIMENSION CONVERSION DIFFERENCE PREDICTION, METHOD FOR MANUFACTURING PHOTOMASK, METHOD FOR MANUFACTURING ELECTRONIC COMPONENT, AND PROGRAM FOR DIMENSION CONVERSION DIFFERENCE PREDICTION

CROSS-REFERENCE TO RELATED APPLICATIONS

This application is based upon and claims the benefit of priority from the prior Japanese Patent Application No. 2007-250221, filed on Sep. 26, 2007; the entire contents of which are incorporated herein by reference.

BACKGROUND OF THE INVENTION

1. Field of the Invention

This invention relates to a method for dimension conversion difference prediction, a method for manufacturing a photomask, a method for manufacturing an electronic component, and a program for dimension conversion difference prediction.

2. Background Art

Patterns in recent semiconductor devices have become remarkably finer. With the shrinkage of the design rule, it is more difficult to transfer a design pattern onto a wafer just as its desired features and dimensions. If any discrepancy occurs between the design pattern and the transferred pattern on the wafer, the deformation of the transferred pattern on the wafer may cause such problems as degradation in electrical characteristics and yield decrease due to bridges and breaks in the pattern.

To solve these problems, such processing as process proximity correction (PPC) is performed, which corrects the features of the mask pattern so that it is transferred just as the desired dimensions thereof.

In the steps of photolithography and etching, the dimensional accuracy of the feature to be formed is greatly affected by its layout environment of the other features placed therearound. Hence, a technique of process proximity correction processing is proposed, which uses the values of the dimension conversion difference determined stepwise in accordance with the distance between the opposed edges of opening features (see, JP-A 2004-363390(Kokai)). In the technique disclosed in JP-A 2004-363390(Kokai), on the basis of the line width and space width at a conversion difference prediction point, a value of the dimension conversion difference is selected from a set of stepwise predetermined values to predict the dimension conversion difference.

However, in the technique disclosed in JP-A 2004-363390 (Kokai), the accuracy of dimension conversion difference prediction can be increased for linear features, but there is room for improvement in increasing the accuracy of dimension conversion difference prediction for nonlinear features (e.g., discontinuous and/or circular features) because of the effect of pattern features.

SUMMARY OF THE INVENTION

According to an aspect of the invention, there is provided a method for dimension conversion difference prediction including: determining an opening angle at a conversion difference prediction point on basis of a design pattern data; and predicting a dimension conversion difference on basis of correlation between the opening angle and an actual measurement value of the dimension conversion difference.

According to another aspect of the invention, there is provided a method for dimension conversion difference prediction including: determining an incident amount of incident objects at a conversion difference prediction point on basis of a design data; and predicting a dimension conversion difference on basis of correlation between the incident amount and an actual measurement value of the dimension conversion difference.

According to another aspect of the invention, there is provided a method for manufacturing a photomask, including: performing process proximity correction on a design pattern data on basis of a dimension conversion difference predicted by the method for dimension conversion difference prediction including: determining an opening angle at a conversion difference prediction point on basis of a design pattern data; and predicting a dimension conversion difference on basis of correlation between the opening angle and an actual measurement value of the dimension conversion difference; and creating an exposure pattern data.

According to another aspect of the invention, there is provided a method for manufacturing an electronic component, including: manufacturing a photomask by the method for manufacturing a photomask, including: performing process proximity correction on a design pattern data on basis of a dimension conversion difference predicted by the method for dimension conversion difference prediction including: determining an opening angle at a conversion difference prediction point on basis of a design pattern data; and predicting a dimension conversion difference on basis of correlation between the opening angle and an actual measurement value of the dimension conversion difference; and creating an exposure pattern data; and performing exposure using the photomask.

According to another aspect of the invention, there is provided a method for manufacturing an electronic component, including: verifying a design pattern data on basis of a dimension conversion difference predicted by the method for dimension conversion difference prediction including: determining an opening angle at a conversion difference prediction point on basis of a design pattern data; and predicting a dimension conversion difference on basis of correlation between the opening angle and an actual measurement value of the dimension conversion difference.

According to another aspect of the invention, there is provided a program for dimension conversion difference prediction causing a computer to perform: calculation of an opening angle at a conversion difference prediction point based on a design pattern data; and prediction of a dimension conversion difference based on correlation between the opening angle and an actual measurement value of the dimension conversion difference.

According to another aspect of the invention, there is provided a program for dimension conversion difference prediction causing a computer to perform: calculation of an incident amount of incident objects at a conversion difference prediction point based on a design data; and prediction of a dimension conversion difference based on correlation between the incident amount and an actual measurement value of the dimension conversion difference.

DETAILED DESCRIPTION OF THE INVENTION

Figure 1A:
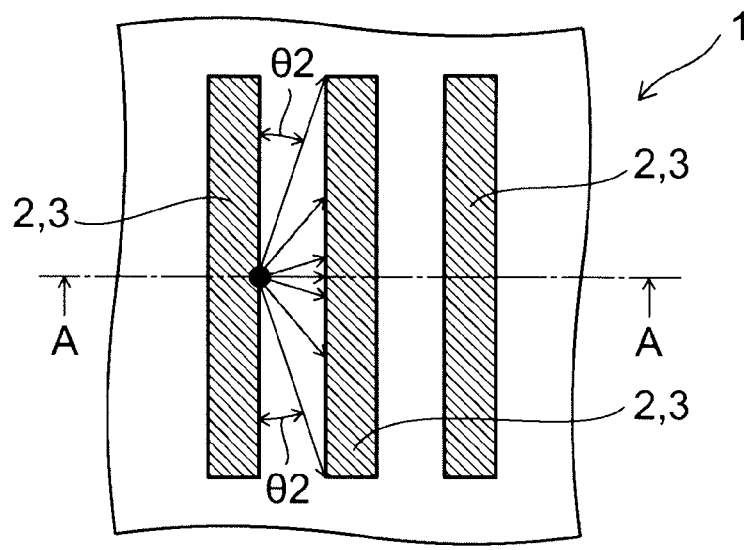
FIGS. 1A to 1C are schematic views for illustrating a method for dimension conversion difference prediction according to a first embodiment of the invention.

Embodiments of the invention will now be illustrated with reference to the drawings. In the drawings, like components are labeled with like reference numerals, and the detailed description thereof is omitted as appropriate.

Figure 1B:
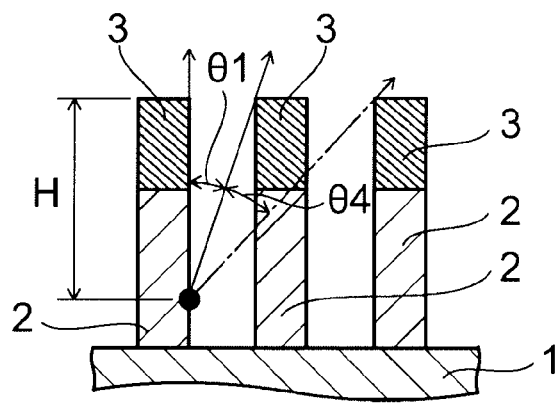
Figure 1C:
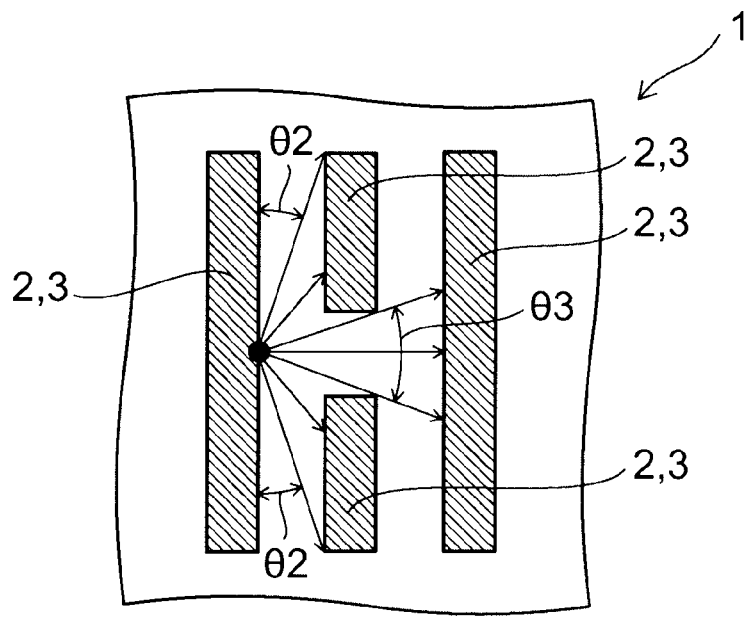

FIG. 1 is a schematic view for illustrating a method for dimension conversion difference prediction according to a first embodiment of the invention. Here, FIG. 1A is a schematic plan view, FIG. 1B is a cross-sectional view taken in the direction of arrows A-A in FIG. 1A, and FIG. 1C is a schematic plan view for illustrating a discontinuous feature.

Figure 2A:
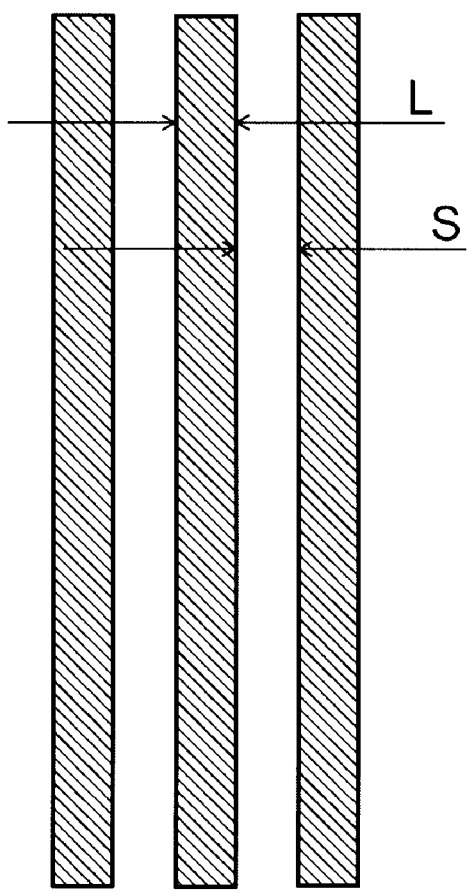
FIGS. 2A and 2B are schematic views for illustrating a method for dimension conversion difference prediction according to a comparative example.
Figure 2B:
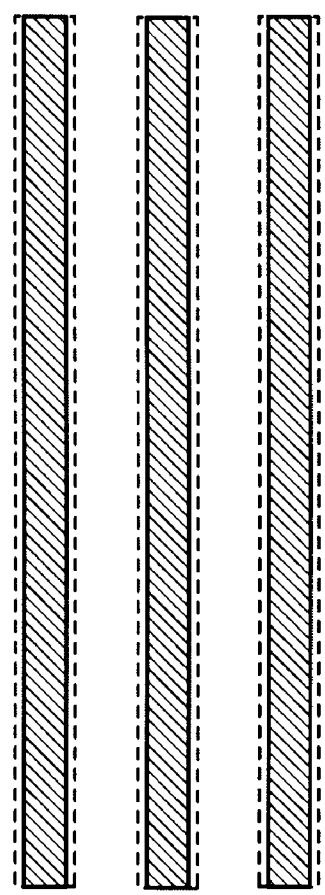

FIG. 2 is a schematic view for illustrating a method for dimension conversion difference prediction according to a comparative example. Here, FIG. 2A is a schematic plan view of a design pattern, and FIG. 2B is a schematic plan view of the pattern transferred onto a wafer.

First, a description is given of the method for dimension conversion difference prediction according to the comparative example illustrated in FIG. 2. The method for dimension conversion difference prediction illustrated in FIG. 2 is what was studied by the inventor in the process of reaching the invention.

If the design pattern shown in FIG. 2A is directly transferred onto a wafer, the line width L is shortened as shown in FIG. 2B. In addition, there may occur rounding of the corner, which is supposed to exhibit 90 degrees in design, and elongation of the line width L.

One of the factors causing these phenomena is what is called the process conversion difference due to the effect of etching (e.g., pattern dependence of etch rate) and the like.

In order to avoid failures due to breaks and bridges in the pattern to achieve desired electrical characteristics as a semiconductor device, dimensions and features just as the design pattern need to be realized on the wafer. To this end, the dimension conversion difference needs to be previously predicted (dimension conversion difference prediction) to correct pattern features on the photomask used in the lithography step.

Here, the dimensional accuracy of the feature to be formed is greatly affected by its layout environment of the other features placed therearound.

Figure 3:
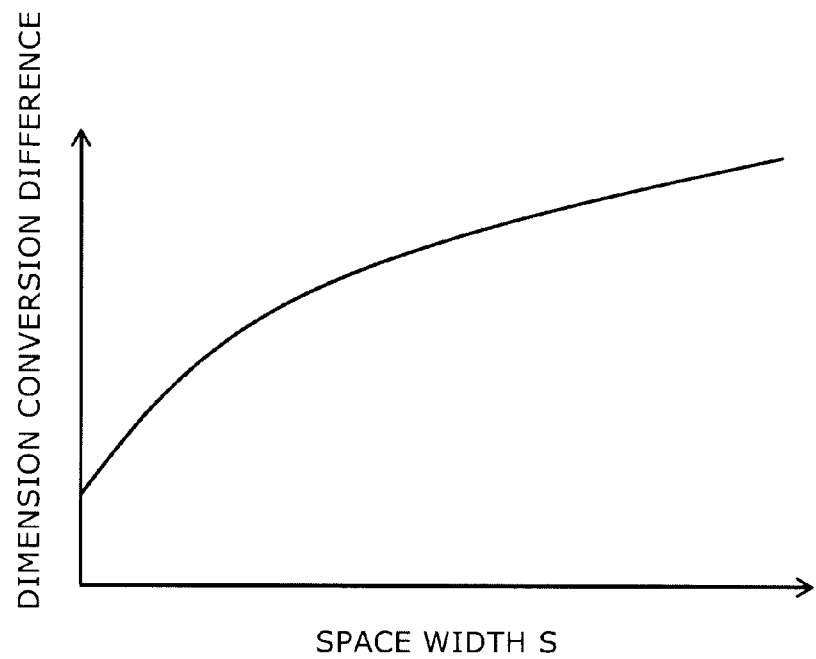
FIG. 3 is a schematic graph for illustrating the relationship between the dimension conversion difference and the space width.

FIG. 3 is a schematic graph for illustrating the relationship between the dimension conversion difference and the space width S.

As shown in FIG. 3, as the space width S increases, the dimension conversion difference also increases. However, the dimension conversion difference is not necessarily proportional to the space width S. Thus, conveniently, on the basis of the line width L and space width S at a conversion difference prediction point, a value of the dimension conversion difference can be selected from a set of stepwise predetermined values to perform dimension conversion difference prediction.

TABLE 1 illustrates values of the dimension conversion difference determined stepwise on the basis of the line width L and space width S. The values of the dimension conversion difference are previously determined by experiments and the like. Here, the line width L is 200 nm (nanometers).

TABLE 1

| Space width [nm] | Dimension conversion difference [nm] |
|---|---|
| S < 150 | 10 |
| 150 ≦ S < 300 | 15 |
| 300 ≦ S < 600 | 20 |
| 600 ≦ S | 25 |

Thus, if the layout environment of the other surrounding features is also considered, the accuracy of dimension conversion difference prediction can be improved. However, actual pattern features are not limited to linear pattern features illustrated in FIG. 2. Nonlinear pattern features cause errors in dimension conversion difference prediction.

Figure 4A:
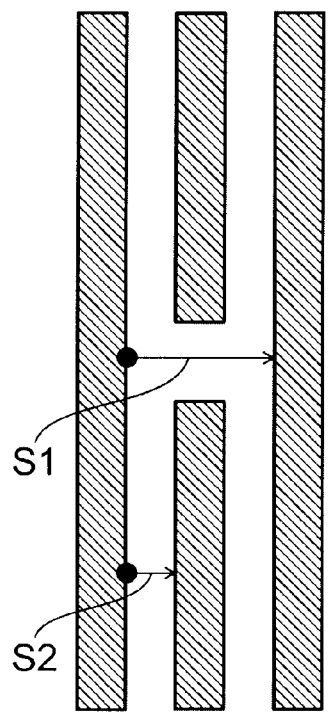
FIGS. 4A and 4B are schematic views for illustrating a nonlinear pattern feature.
Figure 4B:
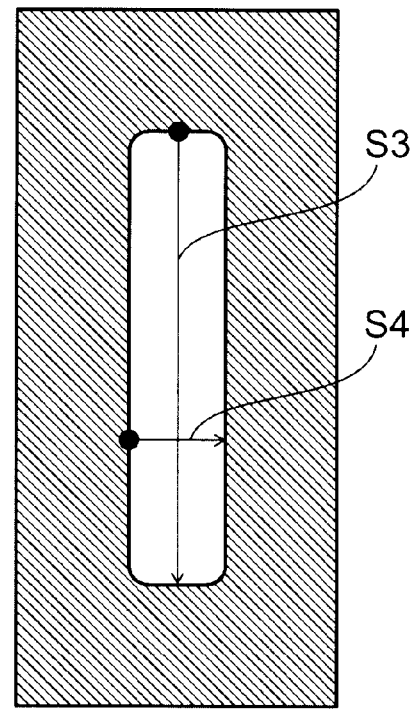

FIG. 4 is a schematic view for illustrating a nonlinear pattern feature. Here, FIG. 4A shows a discontinuous pattern feature, and FIG. 4B shows a circular pattern feature.

As shown in FIG. 4A, the space width S1 at a portion where the adjacent feature is broken is longer than the space width S2 at a portion where the adjacent feature is present. Thus, if the value of the dimension conversion difference is determined from the above TABLE 1, for example, on the basis of the space width S1, then an error occurs.

Likewise, also in the case shown in FIG. 4B, because of the difference in length between the space widths S3 and S4, the value of the dimension conversion difference determined on the basis thereof produces an error.

As a result of study, the inventor has found that the accuracy of dimension conversion difference prediction can be improved irrespective of pattern features by determining the opening angle at a portion subjected to dimension conversion difference prediction (this portion being hereinafter referred to as the conversion difference prediction point) and analyzing the correlation between the opening angle and the actual measurement value of the dimension conversion difference to predict the dimension conversion difference.

Next, returning to FIG. 1, a description is given of the method for dimension conversion difference prediction according to the first embodiment of the invention.

For convenience of description, by way of example, this embodiment is described with reference to the case where an insulating film 2 formed on a wafer 1 is etched by using a resist pattern 3 as a mask.

As shown in FIG. 1B, the conversion difference prediction point is positioned at a dimension H downward (toward the wafer 1) from the surface of the resist pattern 3. Thus, for dimension conversion difference prediction, the opening angle at the conversion difference prediction point is determined.

The opening angle is defined as the angle subtended by a portion of the sphere swept by a half line radiating from the conversion difference prediction point, in which portion the half line does not interfere with the resist pattern 3 or the pattern of the insulating film 2 adjacent thereto. Thus, the opening angle is expressed by a solid angle. Such an opening angle can be determined on the basis of a design pattern data.

For convenience of description, the opening angle is described more specifically with reference to a representative cross section of the "solid" formed as described above. Thus, the angle in the representative cross section is expressed by a plane angle.

For example, the angle (plane angle) perpendicular to the major surface of the wafer 1 is $\theta 1$ as shown in FIG. 1B. The angle (plane angle) parallel to the major surface of the wafer 1 is $\theta 2$ as shown in FIG. 1A.

Here, if the adjacent feature has any broken portion, the angle increases by $\theta 3$ as shown in FIG. 1C. Also in the direction perpendicular to the major surface of the wafer 1, if the adjacent feature has any broken portion, the angle increases by $\theta 4$ as shown in FIG. 1B.

The angle $\theta 1$ perpendicular to the major surface of the wafer 1 varies with the space width S and the vertical position (dimension H) of the conversion difference prediction point. That is, the angle $\theta 1$ increases as the space width S increases, and the angle $\theta 1$ increases as the dimension H decreases.

Figure 5:
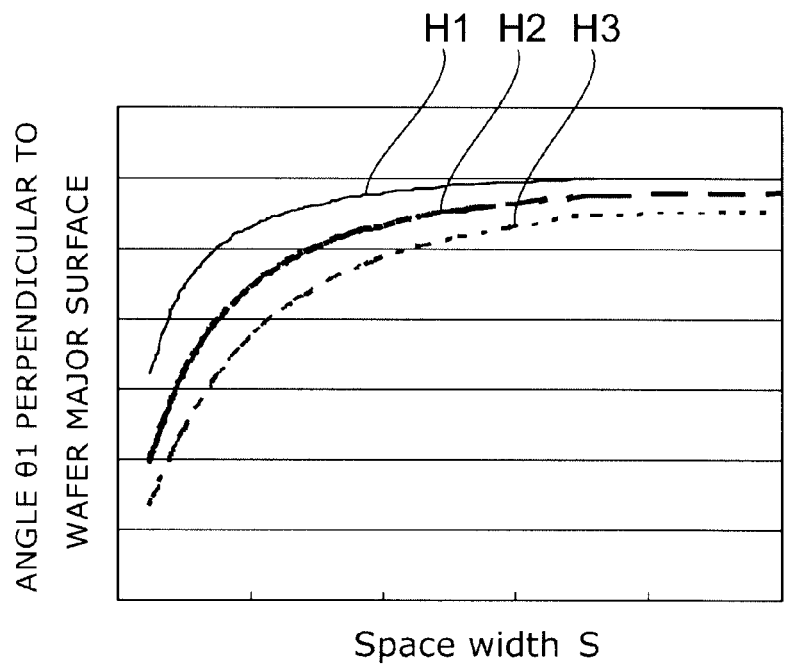
FIG. 5 is a schematic graph for illustrating the effect of the vertical position of the conversion difference prediction point and the space width exerted on the angle perpendicular to the major surface of the wafer.

FIG. 5 is a schematic graph for illustrating the effect of the vertical position (dimension H) of the conversion difference prediction point and the space width S exerted on the angle $\theta 1$ perpendicular to the major surface of the wafer 1. Plots H1 to H3 in the figure show the analyzed relationship between the space width S and the angle $\theta 1$ perpendicular to the major surface of the wafer 1 for each vertical position (dimension H) of the conversion difference prediction point. Here, H1 shows the case where the dimension H is approximately 50 nm (nanometers), H2 shows the case where the dimension H is approximately 100 nm (nanometers), and H3 shows the case where the dimension H is approximately 150 nm (nanometers).

As shown in FIG. 5, the angle $\theta 1$ increases as the space width S increases, and even for the same space width S, the angle $\theta 1$ increases as the dimension H decreases.

Thus, if the relationship between the space width S and the angle $\theta 1$ perpendicular to the major surface of the wafer 1 is previously analyzed for each vertical position (dimension H) of the conversion difference prediction point, the angle $\theta 1$ can be easily calculated using the dimension H as a parameter.

Such an opening angle affects the incident amount of incident objects (e.g., radicals and ions) at the conversion difference prediction point and contributes to the variation in the value of the dimension conversion difference. That is, as the opening angle increases, the amount of incident objects capable of being incident on the conversion difference prediction point increases by the increased amount of the opening angle. This increases the amount of etching and tends to shorten the line width L.

Thus, if the opening angle is considered in dimension conversion difference prediction, the value of the dimension conversion difference reflecting the layout environment in multiple directions can be effectively determined in contrast to the comparative example. Hence, the accuracy of dimension conversion difference prediction can be improved irrespective of pattern features.

Furthermore, as a result of study, the inventor has found that the accuracy of dimension conversion difference prediction can be improved irrespective of pattern features by determining the incident amount of incident objects at the conversion difference prediction point on the basis of the design data and analyzing the correlation between the incident amount and the actual measurement value of the dimension conversion difference.

Figure 6:
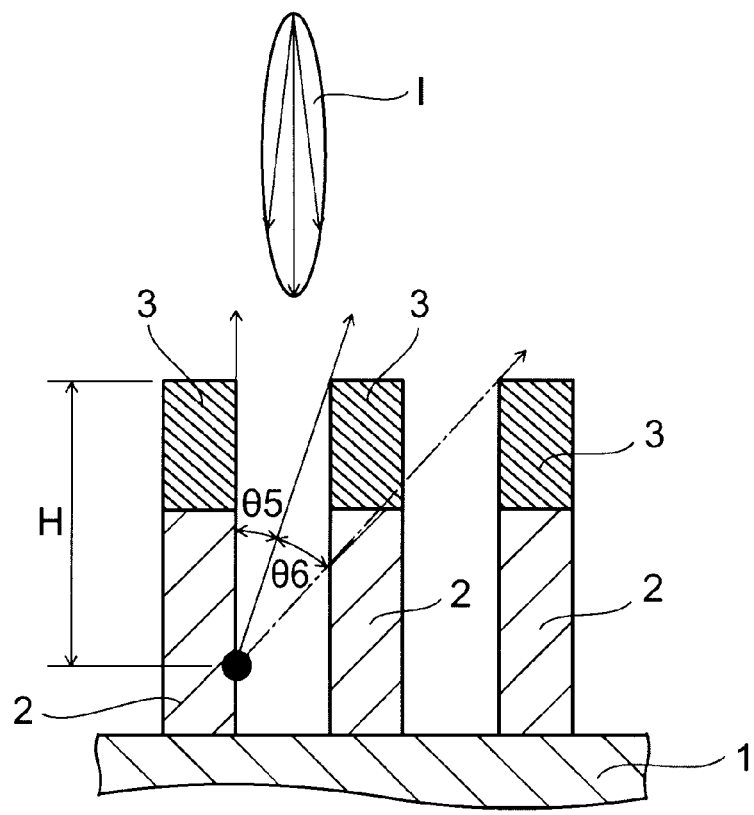
FIG. 6 is a schematic view for illustrating a method for dimension conversion difference prediction according to a second embodiment of the invention.

FIG. 6 is a schematic view for illustrating a method for dimension conversion difference prediction according to a second embodiment of the invention. Here, the same portions as those described with reference to FIG. 1 are labeled with like reference numerals, and the description thereof is omitted.

As shown in FIG. 6, the conversion difference prediction point is positioned at a dimension H downward (toward the wafer 1) from the surface of the resist pattern 3. Thus, for dimension conversion difference prediction, the incident angle at the conversion difference prediction point is determined.

The incident angle is defined as the angle subtended by a portion of the sphere swept by a half line radiating from the conversion difference prediction point, in which portion the half line does not interfere with the resist pattern 3 or the pattern of the insulating film 2 adjacent thereto. Thus, the incident angle is expressed by a solid angle. Such an incident angle can be determined on the basis of the design pattern data.

For convenience of description, the incident angle is described more specifically with reference to a representative cross section of the "solid" formed as described above. Thus, the angle in the representative cross section is expressed by a plane angle.

For example, the angle (plane angle) perpendicular to the major surface of the wafer 1 is $\theta 5$ as shown in FIG. 6. The angle (plane angle) parallel to the major surface of the wafer 1 can be considered similarly to the case of FIG. 1A described above.

The design pattern data as well as the angular distribution of incident objects and the ratio of radicals R to ions I described below can be determined from the design data. That is, the incident amount of incident objects described below can be determined on the basis of the design data.

As shown in FIG. 6, the angle (plane angle) $\theta 5$ perpendicular to the major surface of the wafer 1 is, in the direction perpendicular to the major surface of the wafer 1, the angle (plane angle) subtended by a portion in which the half line radiating from the conversion difference prediction point does not interfere with the resist pattern 3 or the pattern of the insulating film 2 adjacent thereto. Here, if the adjacent feature has any broken portion, the angle increases by $\theta 6$ as shown in FIG. 6.

Such an incident angle affects the incident amount of incident objects at the conversion difference prediction point and contributes to the variation in the value of the dimension conversion difference. That is, as the incident angle increases, the amount of incident objects capable of being incident on the conversion difference prediction point increases by the increased amount of the incident angle. This increases the amount of etching and tends to shorten the line width L.

Furthermore, in this embodiment, the angular distribution of incident objects is also considered to determine the incident amount for dimension conversion difference prediction. Here, the incident objects illustratively include radicals R and ions I generated from a reactive gas in a plasma state.

Figure 7:
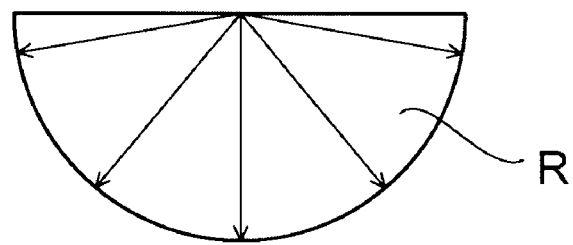
FIG. 7 is a schematic view for illustrating an angular distribution of radicals.

In this case, as shown in FIG. 6, ions I are incident on the conversion difference prediction point with a vertically elongated angular distribution having a narrow spread. On the other hand, as shown in FIG. 7, radicals R are incident on the conversion difference prediction point with a nearly isotropic angular distribution having a wide spread. Thus, in the upper portion of the pattern (near the opening), radicals R are more likely to be incident on the conversion difference prediction point. On the other hand, ions I, which have a vertically elongated angular distribution with a narrow spread, can be relatively easily incident on the conversion difference prediction point even in the lower portion of the pattern (near the bottom).

While FIG. 6 illustrates the directly incident component directed to the conversion difference prediction point, it is also possible to include the N-th reflection component at the sidewall of the pattern.

In dry etching apparatuses, the ratio of radicals R to ions I used for etching depends on the type of etching. For example, radicals R primarily contribute to etching in a CDE (chemical dry etching) apparatus, whereas reactive ion etching is based on synergy between radicals R and ions I. Hence, the ratio of radicals R to ions I used for etching can be also considered to determine the incident amount of incident objects.

Furthermore, the incident amount of incident objects may also depend on the process condition of dry etching. For example, under a high processing pressure, the frequency of collisions between the ion I and the gas particle increases, and the angular distribution tends to spread. On the other hand, under a low processing pressure, the frequency of collisions between the ion I and the gas particle decreases, and the angular distribution tends to narrow. Hence, the process condition of dry etching can be also considered to determine the incident amount of incident objects.

Thus, the accuracy of dimension conversion difference prediction can be improved by considering the incident angle and the angular distribution of incident objects to determine the incident amount of incident objects at the conversion difference prediction point.

Next, a method for dimension conversion difference prediction based on the opening angle is illustrated.

First, the opening angle is calculated as described above. Here, because the space width S is determined at the design time, the angle $\theta 1$ perpendicular to the major surface of the wafer 1 can be treated as a function which takes the dimension H as a variable. Hence, the opening angle, which is a solid angle including the plane angle $\theta 1$, can be also treated as a function $\theta(H)$ which takes the dimension H as a variable.

Consequently, for example, the dimension conversion difference CD can be expressed by a function given by the following equation (1):

$$\text{Dimension conversion difference } CD = \alpha + \beta \times \text{opening angle } \theta(H) \quad (1)$$

where $\alpha$ and $\beta$ are coefficients, which can be determined by the regression analysis technique described below.

The least square method can be used to determine the coefficients $\alpha$, $\beta$ in equation (1) by regression analysis. More specifically, the coefficients $\alpha$, $\beta$ can be determined so as to minimize the squared average of the difference between the actual measurement value (experimental value) and the calculated value of the dimension conversion difference. Here, it is also possible to perform the above calculation by selecting the dimension H such that the error with respect to the actual measurement value is minimized.

Figure 8:
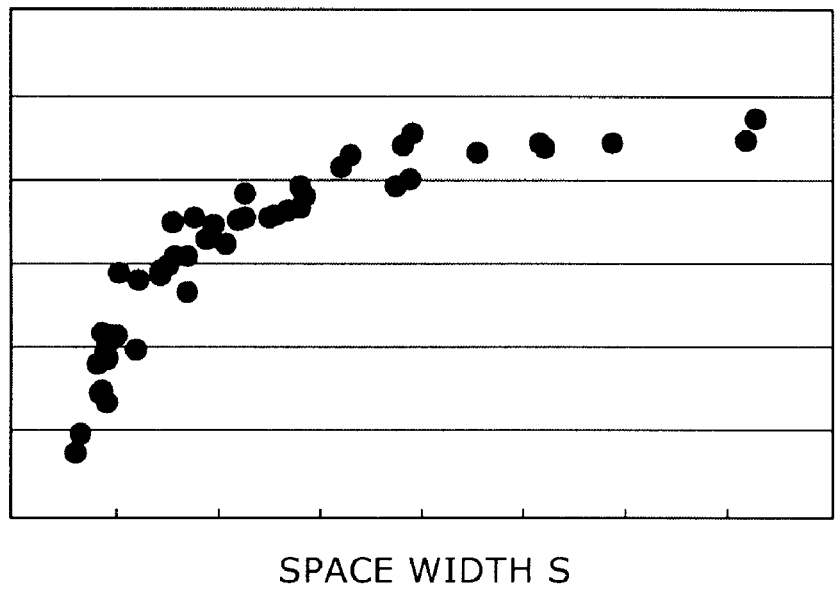
FIG. 8 is a schematic graph for illustrating the actual measurement values (experimental values) of the dimension conversion difference.

FIG. 8 is a schematic graph for illustrating the actual measurement values (experimental values) of the dimension conversion difference.

The above determination of the coefficients $\alpha$, $\beta$ can be facilitated by measuring the actual measurement values (experimental values) of the dimension conversion difference as shown in FIG. 8 for each of the predetermined dimensions H and compiling the values into a database.

Figure 9:
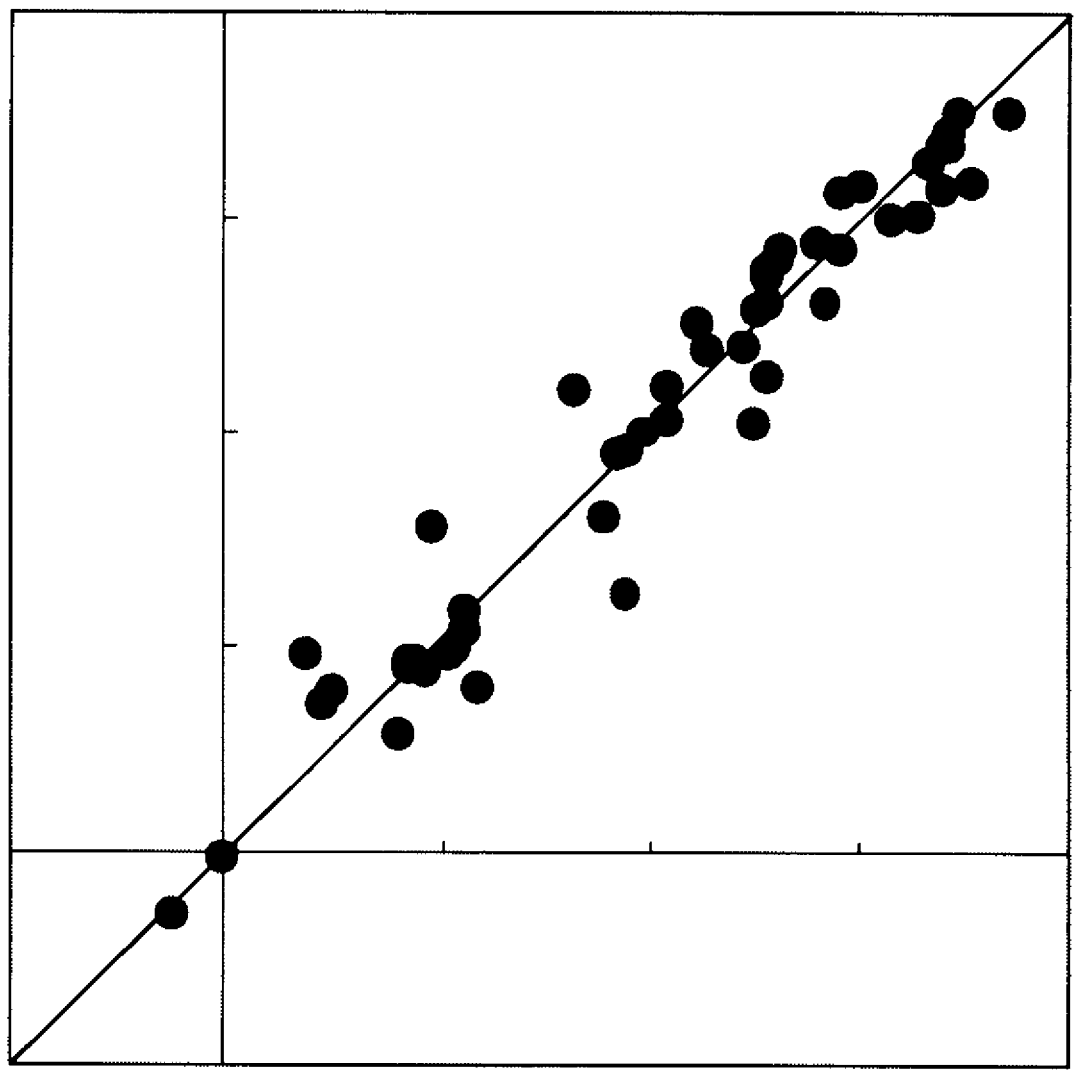
FIG. 9 is a schematic graph for illustrating the relationship between the function-based values and the actual measurement values (experimental values) of the dimension conversion difference.

FIG. 9 is a schematic graph for illustrating the relationship between the function-based values and the actual measurement values (experimental values) of the dimension conversion difference. In the graph, bullets represent the actual measurement values (experimental values) of the dimension conversion difference, and the straight line represents the functional expression (equation (1)) of the dimension conversion difference. Here, the functional expression of the dimension conversion difference determined as described above is given by the following expression:

$$\text{Dimension conversion difference } CD = -27.9 + 15.2 \times \text{opening angle } \theta(H)$$

It is seen from FIG. 9 that the values of the dimension conversion difference based on the expression of the dimension conversion difference as determined by regression analysis well approximate the actual measurement values (experimental values) of the dimension conversion difference. By determining the dimension conversion difference using the expression of the dimension conversion difference, it is possible to perform pattern correction and danger point verification for a photomask as described below.

The values of the coefficients $\alpha$, $\beta$ are not limited to the foregoing, but can be suitably determined on the basis of the actual measurement values (experimental values) of the dimension conversion difference measured under various specific conditions.

Furthermore, it is also possible to determine stepwise the value of the dimension conversion difference on the basis of the opening angle.

The following TABLE 2 illustrates values of the dimension conversion difference determined stepwise on the basis of the opening angle.

TABLE 2

| Opening angle [steradian] | Dimension conversion difference [nm] |
| --- | --- |
| Opening angle < 1.8 | −1 |
| 1.8 ≦ Opening angle < 1.9 | 0 |
| 1.9 ≦ Opening angle < 2.0 | 2 |
| 2.0 ≦ Opening angle < 2.1 | 3 |
| 2.1 ≦ Opening angle < 2.2 | 5 |
| 2.2 ≦ Opening angle < 2.3 | 6 |
| 2.3 ≦ Opening angle < 2.4 | 8 |
| 2.4 ≦ Opening angle < 2.5 | 9 |
| 2.5 ≦ Opening angle < 2.6 | 11 |
| 2.6 ≦ Opening angle < 2.7 | 12 |
| 2.7 ≦ Opening angle < 2.8 | 14 |

TABLE 2-continued

| Opening angle [steradian] | Dimension conversion difference [nm] |
|---|---|
| 2.8 ≦ Opening angle < 2.9 | 15 |
| 2.9 ≦ Opening angle < 3.0 | 17 |
| 3.0 ≦ Opening angle < 3.1 | 18 |
| 3.1 ≦ Opening angle < 3.2 | 20 |
| 3.2 ≦ Opening angle | 20 |

Hence, the discrepancy from the actual measurement value (experimental value) can be reduced by determining stepwise the dimension conversion difference using regression analysis and the like. On the basis of the value of the dimension conversion difference determined stepwise, it is possible to perform pattern correction and danger point verification for a photomask as described below.

The foregoing has described the method for dimension conversion difference prediction based on the opening angle. Likewise, the method for dimension conversion difference prediction can be also based on the incident amount of incident objects at the conversion difference prediction point described above. That is, also in this case, the expression of the dimension conversion difference can be determined by regression analysis, and the dimension conversion difference can be determined stepwise. On the basis of the value of the dimension conversion difference thus determined, it is possible to perform pattern correction and danger point verification for a photomask as described below.

The analysis technique illustrated in the foregoing is the regression analysis technique, which is a kind of multivariate analysis techniques, but the invention is not limited thereto. For example, other multivariate analysis techniques or response surface techniques can be used to analyze the correlation between the opening angle or incident amount and the actual measurement value (experimental value) of the dimension conversion difference to develop a compact model, and dimension conversion difference prediction can be performed on the basis of the model under various specific conditions.

As described above, according to this embodiment, the accuracy of dimension conversion difference prediction can be improved irrespective of pattern features, and hence process proximity correction can be accurately performed. Thus, it is possible to prevent degradation in electrical characteristics due to the deformed pattern as well as bridges and breaks in the pattern, achieving improvement in quality as well as productivity.

Furthermore, danger points can be also accurately extracted, and hence the verification accuracy for the design data can be also improved.

Next, a method for manufacturing a photomask according to an embodiment of the invention is illustrated.

Figure 10:
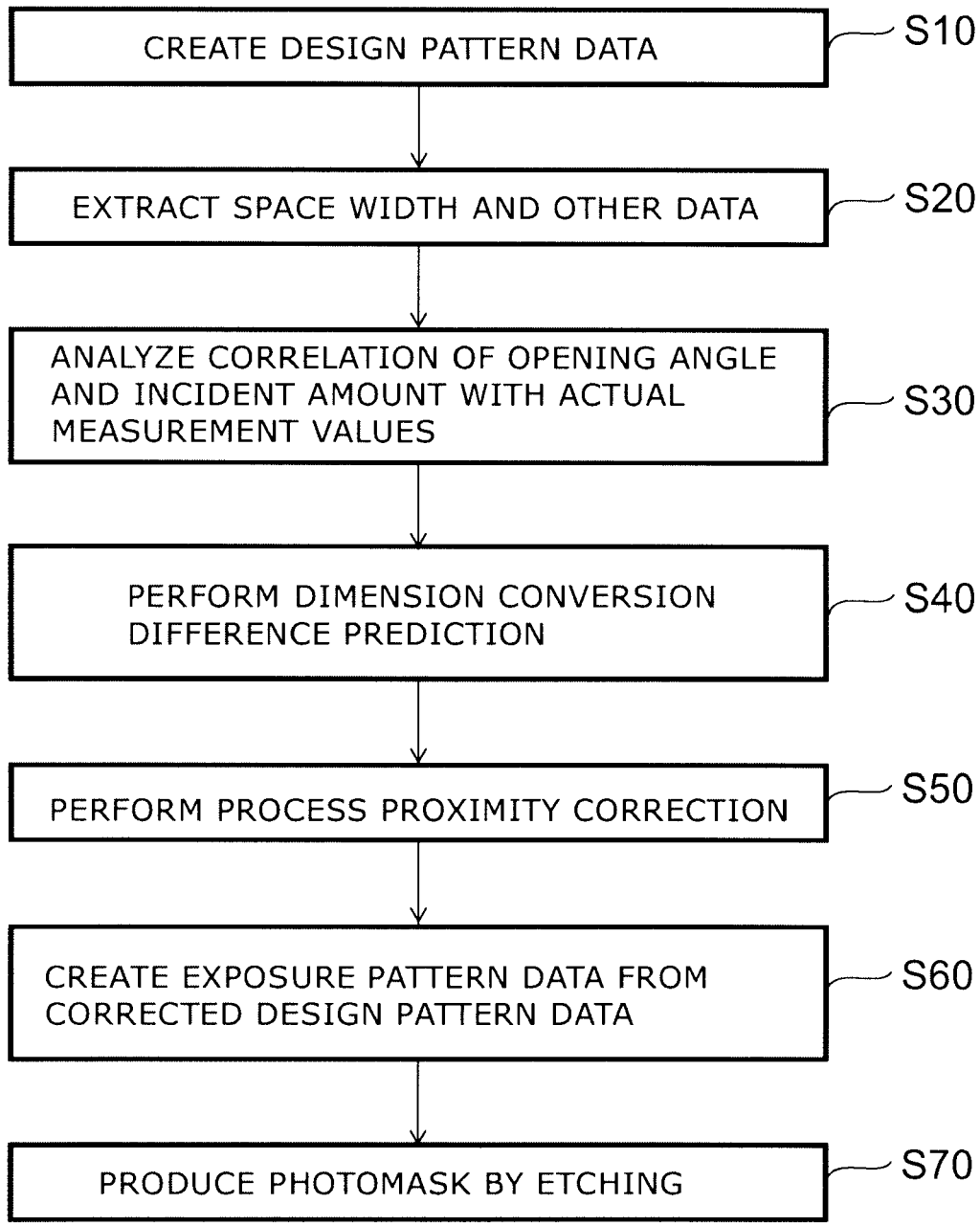
FIG. 10 is a flow chart for illustrating a method for manufacturing a photomask according to the embodiment of the invention.

FIG. 10 is a flow chart for illustrating a method for manufacturing a photomask according to the embodiment of the invention.

First, a design pattern data (the data of a pattern to be formed on a wafer) is created (step S10).

Next, the space width S, the line width L, pattern features and other data are extracted from the design pattern data (step S20).

Next, the opening angle and the incident amount (the incident angle and the angular distribution of incident objects) described above are calculated to analyze their correlation with the actual measurement values (experimental values) of the dimension conversion difference measured previously (step S30).

Here, with regard to the angular distribution of incident objects, the ratio of radicals to ions described above can be also considered.

Next, dimension conversion difference prediction is performed by calculating the value of the dimension conversion difference using the expression of the dimension conversion difference obtained as a result of the analysis or by selecting a value of the dimension conversion difference from a table in which the values of the dimension conversion difference obtained as a result of the analysis are compiled stepwise (step S40).

Next, process proximity correction is performed using the determined value of the dimension conversion difference (step S50). Here, optical proximity correction can be also performed simultaneously. Conventionally known techniques are applicable to the optical proximity correction, and hence the description thereof is omitted.

If the corrected design pattern data includes any portion violating the design rule, the design pattern data is modified, and the modified data can be again subjected to process proximity correction and optical proximity correction.

Next, an exposure pattern data is created from the corrected design pattern data (step S60).

As described above, the design pattern data is corrected on the basis of the dimension conversion difference predicted by the above method for dimension conversion difference prediction, and the exposure pattern data is created.

Next, a photomask is produced by etching on the basis of the created exposure pattern data (step S70).

Figure 11:
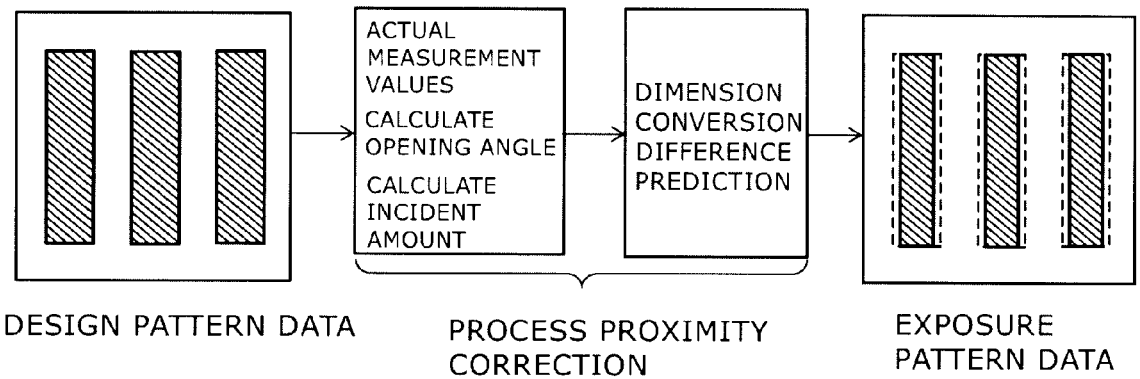
FIG. 11 is a block diagram of the method for manufacturing a photomask.

FIG. 11 is a block diagram of the method for manufacturing a photomask.

As shown in FIG. 11, an exposure pattern data is created by performing process proximity correction on the design pattern data. Here, the opening angle and incident amount as described above are calculated to analyze their correlation with actual measurement values, and dimension conversion difference prediction is performed on the basis thereof.

According to this embodiment, the accuracy of dimension conversion difference prediction can be improved irrespective of pattern features, and hence accurate correction can be performed. Thus, a photomask with small dimension conversion difference can be obtained. Furthermore, extraction of danger points and calculation of interconnect resistance and capacitance can be accurately performed, and hence a photomask with high manufacturing yield can be obtained.

Next, a method for manufacturing an electronic component according to an embodiment of the invention is described with a method for manufacturing a semiconductor device taken as an example.

The method for manufacturing a semiconductor device includes repeating the step of forming a pattern on a wafer by film formation, resist coating, exposure, development, etching, and resist removal, and the steps of inspection, cleaning, heat treatment, impurity doping, diffusion, and planarization. In such a method for manufacturing a semiconductor device, a photomask is manufactured by the above method for manufacturing a photomask, and exposure is performed using the photomask thus manufactured. Furthermore, verification of the design pattern data such as extraction of danger points is performed on the basis of the dimension conversion difference predicted by the above method for dimension conversion difference prediction.

The steps other than the method for dimension conversion difference prediction and the method for manufacturing a photomask described above can be based on conventionally known techniques for the respective steps, and hence the description thereof is omitted.

Figure 12:
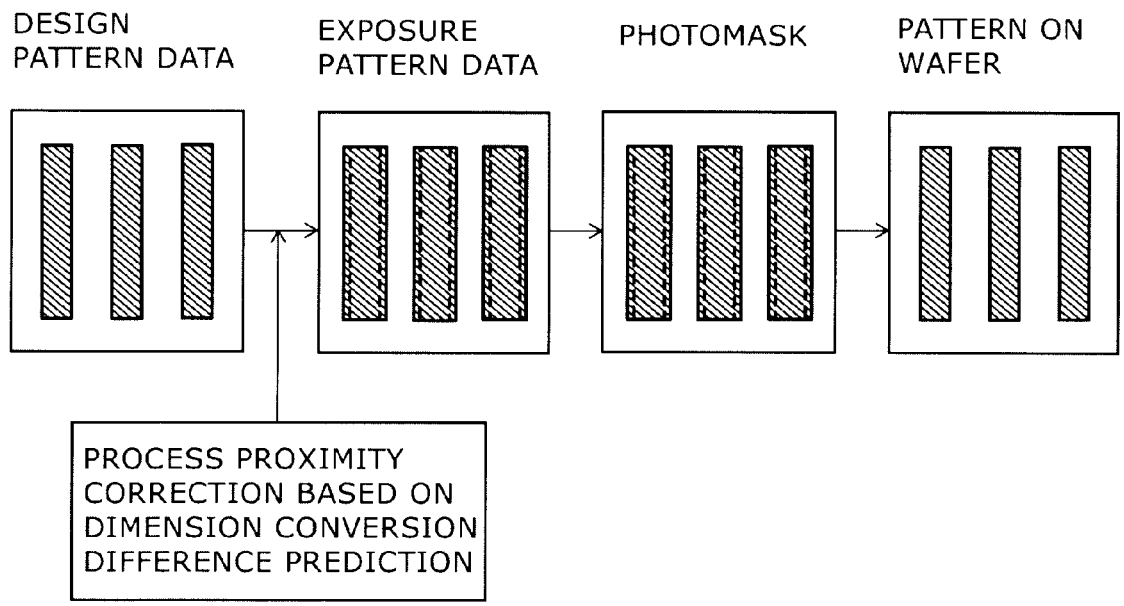
FIG. 12 is a block diagram for illustrating manufacturing and exposure of a photomask.

FIG. 12 is a block diagram for illustrating manufacturing and exposure of a photomask.

As shown in FIG. 12, process proximity correction based on dimension conversion difference prediction is performed on a design pattern data, and an exposure pattern data is created from the corrected design pattern data. Here, optical proximity correction can be also performed simultaneously. Next, a photomask is produced on the basis of the exposure pattern data, and the photomask is used to perform exposure, development, etching, and resist removal to form a pattern on a wafer. Here, the accuracy can be improved in extracting danger points from the corrected design pattern data and calculating interconnect resistance and capacitance.

For convenience of description, this embodiment has been described with reference to an example in which the method for dimension conversion difference prediction and the method for manufacturing a photomask according to the embodiments of the invention are used to manufacture a semiconductor device, but the invention is not limited thereto. For example, the invention is widely applicable to manufacturing of electronic components based on photolithography such as pattern formation in manufacturing liquid crystal display devices (e.g., manufacturing of color filters and array substrates).

Next, a program for dimension conversion difference prediction according to an embodiment of the invention is illustrated.

The program for dimension conversion difference prediction according to this embodiment is intended to cause a computer to perform the method for dimension conversion difference prediction based on the opening angle or the method for dimension conversion difference prediction based on the incident amount of incident objects described above.

Figure 13:
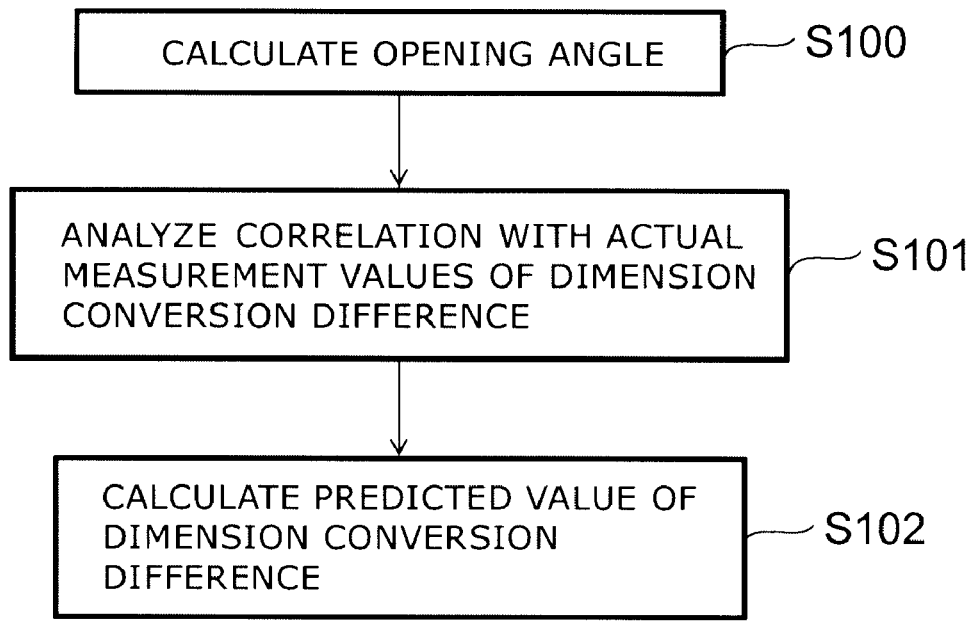
FIG. 13 is a flow chart for illustrating the operation sequence of a program for dimension conversion difference prediction according to an embodiment of the invention.

FIG. 13 is a flow chart for illustrating the operation sequence of a program for dimension conversion difference prediction according to an embodiment of the invention. Here, FIG. 13 is a flow chart for illustrating the operation sequence of a program for dimension conversion difference prediction based on the opening angle.

First, the space width and the like are extracted from a design pattern data inputted to a computer, and an opening angle is calculated on the basis of the extracted data (step S100).

Next, correlation is analyzed between the actual measurement values (experimental values) of the dimension conversion difference inputted to the computer and the calculation expression of the dimension conversion difference parameterized by the opening angle (step S101).

Next, a predicted value of the dimension conversion difference is calculated on the basis of the calculation expression determined by the analysis (step S102).

Here, calculation of the opening angle and the analysis of correlation are the same as those described above, and hence the description thereof is omitted. The configuration of the computer and the input device can be also based on conventionally known techniques, and hence the description thereof is omitted.

Figure 14:
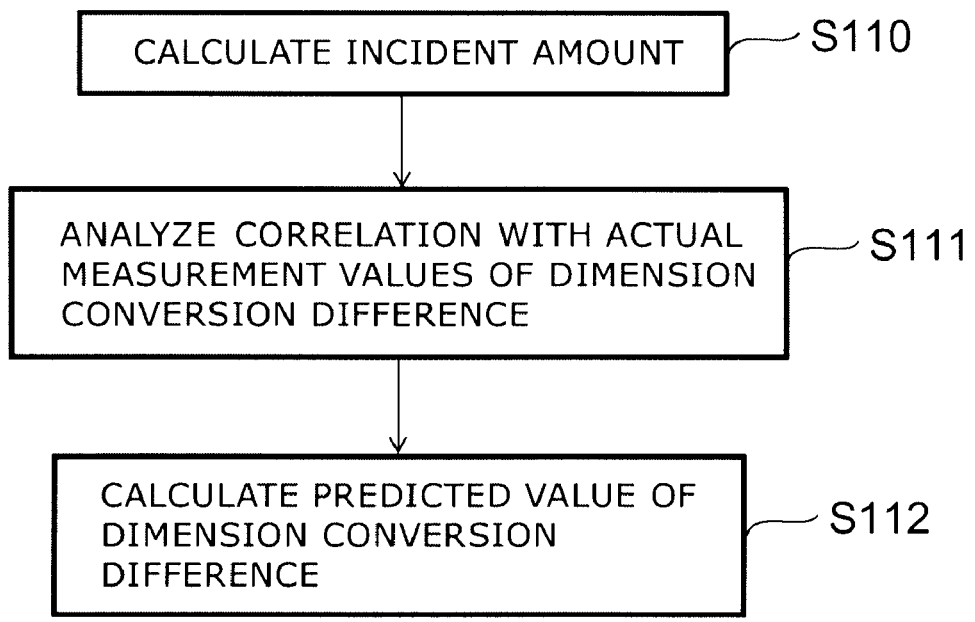
FIG. 14 is a flow chart for illustrating the operation sequence of a program for dimension conversion difference prediction according to another embodiment of the invention.

FIG. 14 is a flow chart for illustrating the operation sequence of a program for dimension conversion difference prediction according to another embodiment of the invention. Here, FIG. 14 is a flow chart for illustrating the operation sequence of a program for dimension conversion difference prediction based on the incident amount of incident objects.

First, the space width and the like are extracted from a design data (the portion of its design pattern data) inputted to a computer, and an incident angle is calculated on the basis of the extracted data. Then, the angular distribution of incident objects and the like are extracted from the design data inputted to the computer, and an incident amount is calculated on the basis of the incident angle, the angular distribution of incident objects and the like (step S110).

Next, correlation is analyzed between the actual measurement values (experimental values) of the dimension conversion difference inputted to the computer and the calculation expression of the dimension conversion difference parameterized by the incident amount (step S111).

Next, a predicted value of the dimension conversion difference is calculated on the basis of the calculation expression determined by the analysis (step S112).

Here, calculation of the incident angle and incident amount and the analysis of correlation are the same as those described above, and hence the description thereof is omitted. The configuration of the computer and the input device can be also based on conventionally known techniques, and hence the description thereof is omitted.

The embodiments of the invention have been illustrated. However, the invention is not limited to the above description.

The above embodiments can be suitably modified by those skilled in the art, and such modifications are also encompassed within the scope of the invention as long as they fall within the spirit of the invention.

The elements included in the above embodiments can be combined with each other as long as feasible, and such combinations are also encompassed within the scope of the invention as long as they fall within the spirit of the invention.

The invention claimed is:

1. A method for dimension conversion difference prediction, the method being performed by a computer, the method comprising:
    determining, by the computer, an opening angle at a conversion difference prediction point on basis of a design pattern data, the opening angle is an angle subtended by a portion of a sphere swept by a half line radiating from the conversion difference prediction point, in which portion the half line does not interfere with an adjacent pattern; and
    predicting a dimension conversion difference on basis of correlation between the opening angle and an actual measurement value of the dimension conversion difference.

2. The method for dimension conversion difference prediction according to claim 1, wherein said predicting uses a multivariate analysis technique or a response surface technique to predict the dimension conversion difference on basis of the correlation.

3. A method for manufacturing a photomask, the method being performed by a computer, the method comprising:
    performing process proximity correction on a design pattern data on basis of a dimension conversion difference predicted by the method for dimension conversion difference prediction including:
        determining an opening angle at a conversion difference prediction point on basis of a design pattern data, the opening angle is an angle subtended by a portion of a sphere swept by a half line radiating from the conversion difference prediction point, in which portion the half line does not interfere with an adjacent pattern; and
        predicting a dimension conversion difference on basis of correlation between the opening angle and an actual measurement value of the dimension conversion difference;
    creating an exposure pattern data and manufacturing the photomask using the exposure pattern data.

4. The method for manufacturing a photomask according to claim 3, further comprising:
performing optical proximity correction.

5. A method for manufacturing an electronic component, the method being performed by a computer, the method comprising:
manufacturing a photomask by the method for manufacturing a photomask, including:
performing process proximity correction on a design pattern data on basis of a dimension conversion difference predicted by the method for dimension conversion difference prediction including:
determining an opening angle at a conversion difference prediction point on basis of a design pattern data, the opening angle is an angle subtended by a portion of a sphere swept by a half line radiating from the conversion difference prediction point, in which portion the half line does not interfere with an adjacent pattern; and
predicting a dimension conversion difference on basis of correlation between the opening angle and an actual measurement value of the dimension conversion difference; and
creating an exposure pattern data; and
performing exposure using the photomask.

6. A method for manufacturing an electronic component, the method being performed by a computer, the method comprising:
verifying a design pattern data on basis of a dimension conversion difference predicted by the method for dimension conversion difference prediction including:
determining an opening angle at a conversion difference prediction point on basis of a design pattern data, the opening angle is an angle subtended by a portion of a sphere swept by a half line radiating from the conversion difference prediction point, in which portion the half line does not interfere with an adjacent pattern; and
predicting a dimension conversion difference on basis of correlation between the opening angle and an actual measurement value of the dimension conversion difference;
modifying the design pattern data;
creating an exposure pattern data from modified the design pattern data;
manufacturing a photomask using the exposure pattern data; and
performing exposure using the photomask.

7. A non-transitory computer readable medium including computer executable instructions for dimension conversion difference prediction causing a computer to perform:
calculation of an opening angle at a conversion difference prediction point based on a design pattern data, the opening angle is an angle subtended by a portion of a sphere swept by a half line radiating from the conversion difference prediction point, in which portion the half line does not interfere with an adjacent pattern; and
prediction of a dimension conversion difference based on correlation between the opening angle and an actual measurement value of the dimension conversion difference.

* * * * *